(12) United States Patent
Finocchiaro et al.

(10) Patent No.: US 11,405,042 B2
(45) Date of Patent: Aug. 2, 2022

(54) TRANSCEIVER CARRIER FREQUENCY TUNING

(71) Applicant: Texas Instruments Incorporated, Dallas, TX (US)

(72) Inventors: Salvatore Luciano Finocchiaro, Dallas, TX (US); Timothy Schmidl, Dallas, TX (US); Tolga Dinc, Dallas, TX (US); Gerd Schuppener, Allen, TX (US); Siraj Akhtar, Richardson, TX (US); Swaminathan Sankaran, Allen, TX (US); Baher Haroun, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/731,800

(22) Filed: Dec. 31, 2019

(65) Prior Publication Data

US 2021/0203331 A1    Jul. 1, 2021

(51) Int. Cl.
*H03L 7/099* (2006.01)
*H03L 7/08* (2006.01)
(Continued)

(52) U.S. Cl.
CPC ............ *H03L 7/099* (2013.01); *H03L 7/0807* (2013.01); *H03L 7/093* (2013.01); *H04B 1/40* (2013.01);
(Continued)

(58) Field of Classification Search
CPC ....... H04L 7/099; H04L 7/0331; H04L 27/12; H04L 27/14; H03L 7/0807; H03L 7/093; H04B 1/40
See application file for complete search history.

(56) References Cited

U.S. PATENT DOCUMENTS 5,991,605 A    11/1999   Rapeli
7,535,953 B2    5/2009   Nomura et al.
(Continued)

FOREIGN PATENT DOCUMENTS

EP    0798880 A2    10/1997

OTHER PUBLICATIONS

Search Report for PCT Patent Application No. PCT/US2020/067104, date of mailing of the international search report dated Mar. 25, 2021, 1 page.

*Primary Examiner* — Syed Haider
(74) *Attorney, Agent, or Firm* — Valerie M. Davis; Charles A. Brill; Frank D. Cimino

(57) ABSTRACT

In described examples, a method of operating a transceiver with a transmitter and a receiver includes generating a frequency reference. In the transmitter: A phase locked loop (PLL) generates a first voltage controlled oscillator (VCO) control voltage responsive to the frequency reference. A VCO in the transmitter generates a transmitter VCO signal responsive to the first VCO control voltage, and the PLL is locked to the transmitter VCO signal. In the receiver: A signal is received. A receiver VCO generates a receiver VCO signal responsive to the first or a second VCO control voltage. The receiver VCO signal is multiplied by the received signal to generate an I component, and by the received signal phase shifted by 90° to generate a Q component. The second VCO control signal is generated responsive to the I component and the Q component.

33 Claims, 10 Drawing Sheets

(51) Int. Cl.
  *H03L 7/093*     (2006.01)
  *H04L 27/14*     (2006.01)
  *H04L 7/033*     (2006.01)
  *H04L 27/12*     (2006.01)
  *H04B 1/40*      (2015.01)

(52) U.S. Cl.
  CPC ............ *H04L 7/0331* (2013.01); *H04L 27/12* (2013.01); *H04L 27/14* (2013.01)

(56) References Cited

U.S. PATENT DOCUMENTS

| | | | |
|---|---|---|---|
| 7,787,835 B2 | 8/2010 | Kato | |
| 2003/0100283 A1* | 5/2003 | Wu | H03J 7/20 |
| | | | 455/258 |
| 2007/0013427 A1* | 1/2007 | Nomura | H03K 5/1504 |
| | | | 327/276 |
| 2007/0147566 A1* | 6/2007 | Laturell | H04L 7/033 |
| | | | 375/355 |
| 2007/0159259 A1* | 7/2007 | Suh | H03B 21/02 |
| | | | 331/2 |
| 2008/0233892 A1 | 9/2008 | Marholev et al. | |
| 2010/0120389 A1* | 5/2010 | Blum | H03L 7/07 |
| | | | 455/208 |
| 2010/0232530 A1* | 9/2010 | Ebisawa | H04L 27/3809 |
| | | | 375/261 |
| 2010/0277360 A1* | 11/2010 | Lee | G01S 5/0289 |
| | | | 342/125 |

\* cited by examiner

TRANSCEIVER CARRIER FREQUENCY TUNING

TECHNICAL FIELD

This application relates generally to transceivers, and more particularly to synchronization of timing signals in transmitter/receiver pairs.

BACKGROUND

FIG. 1 (prior art) shows an example of a functional block layout of a transceiver (transmitter/receiver) system 100. The transceiver system 100 comprises two transceivers 102—a first transceiver 102a and a second transceiver 102b—communicating with each other. Each transceiver 102a, 102b includes a respective frequency reference 104a, 104b (such as a bulk acoustic wave resonator) connected to output to a respective transmitter phase locked loop 106a, 106b (Tx PLL 106) and to a respective receiver phase locked loop 108a, 108b (Rx PLL 108). (Herein, phase locked loop is abbreviated PLL, transmitter is abbreviated Tx, and receiver is abbreviated Rx.) Each Tx PLL 106a, 106b is communicatively connected to a transmitter 110a, 110b (Tx), and each Rx PLL 108a, 108b is communicatively connected to a receiver 112a, 112b (Rx).

A Tx voltage control block 114a, 114b in the Tx PLL 106a, 106b is connected to output a Tx voltage control signal 116a, 116b (Vctrl) to a Tx voltage controlled oscillator 118a, 118b (VCO). The frequency reference 104a, 104b and the respective Tx voltage control signal 116a, 116b (Vctrl) control the respective Tx VCO 118a, 118b to generate a carrier signal at a specified frequency. Accordingly, the Tx VCO 118a, 118b outputs a carrier signal with a frequency that is an integer or fractional multiple of the frequency generated by the frequency reference 104a, 104b, offset by an amount determined by the respective Tx voltage control signal 116a, 116b. The Tx VCO 118a, 118b is connected to output the respective carrier signal to a Tx mixer 120a, 120b, that mixes the carrier signal with one or more data signals (corresponding to one or more channels) to produce a Tx output signal 122a, 122b. Accordingly, the Tx mixer 120a, 120b modulates the carrier signal with the data signals to produce the Tx output signal 122a, 122b. The Tx mixer 120a, 120b is connected to output the Tx output signal 122a, 122b to the transmitter 110a, 110b. The transmitter 110a on the first transceiver 102a (or 110b on the second transceiver 102b) transmits the Tx output signal 122a to a receiver 112b on the second transceiver 102b (or to the receiver 112a on the first transceiver 102a, respectively).

By way of example from the first transceiver 102a to the second transceiver 102b, the receiver 112b receives the Tx output signal 122a, which has been phase shifted by transmission time. The amount of this phase shift is generally unpredictable due to factors, such as length and radius of the transmission medium (affected by, for example, manufacturing tolerances of the transmission medium and temperature variability), that affect transmittance of the transmission medium, such as air or wire or wave guide. A Rx voltage control block 124b in the Rx PLL 108b is connected to output a Rx voltage control signal 126b (Vctrl) to a Rx VCO 128b. Generally, the frequency references 104a, 104b of the respective first and second transceivers 102a, 102b are specified to output the same frequency. The frequency reference 104b and the Rx voltage control signal 126b (Vctrl) control the Rx VCO 128b to generate a recovered carrier signal that has approximately the same frequency as the carrier signal. Accordingly, Vctrl 126b changes, tuning the frequency of the recovered carrier signal until the frequency of the recovered carrier signal matches the frequency of the transceiver 102a carrier signal, and the Rx PLL 108b phase locks to the carrier signal component of the Tx output signal 122a as phase shifted by the transmission time from the transmitter 110a to the receiver 112b. Accordingly, the Rx VCO 128b outputs the recovered carrier signal with the phase of the Tx output signal 122a (the modulated carrier signal) as received by the receiver 120b.

The Rx VCO 128b is connected to output the recovered carrier signal to a Rx mixer 130b. The Rx mixer 130b mixes the recovered carrier signal with the Tx output signal as received by the receiver 120b, and the result is filtered to recover data signals.

FIG. 2 (prior art) shows an example of a functional block layout of a Costas loop 200. As shown in FIG. 2, a signal 202, which includes a carrier signal modulated by an input signal and is phase shifted as a result of transmission, is received by the Costas loop 200. The input signal 202 is an input into a first multiplier 204 (a product detector, which is a frequency mixer) and a second multiplier 206. The multipliers 204, 206 act as phase detectors for the Costas loop 200. A voltage controlled oscillator 208 (VCO) is connected to output to the first multiplier 204, and is connected to output to a 90° phase shifter 210. The 90° phase shifter 210 is connected to output to the second multiplier 206. The first multiplier 204 is connected to output to a first low pass filter 212 (LPF), and the second multiplier 206 is connected to output to a second LPF 214. The first and second LPFs 212, 214 filter out high-frequency signal components induced by multiplication of the signal 202 with the VCO 208 output or the 90 degree phase shifted VCO 208 output. The first LPF 212 is connected to output to a first limit amplifier 216 and a third multiplier 218. The second LPF 214 is connected to output to a second limit amplifier 220 and a fourth multiplier 222. The first limit amplifier 216 is connected to output to the fourth multiplier 222. The second limit amplifier 220 is connected to output to the third multiplier 218. The third and fourth multipliers 218, 222 are each connected to output to an adder 224. The adder 224 is connected to output to a loop filter 226. The loop filter 226 is connected to output to the VCO 208. As expressed below, the output of the loop filter 226 tunes (controls) the VCO 208 so that the frequency and phase shift of the waveform output by the VCO 208 matches the frequency $f_0$ of the carrier signal and the phase shift $\varphi_0$ of the signal 202.

The Costas loop 200 is used to recover frequency and phase of the carrier signal, to enable recovery of the input signal by which the carrier signal is modulated using quadrature amplitude modulation. The signal 202 can generally be expressed as:

$$r(t) = d_k \cos(2\pi f_0 t + \varphi_0) + q_k \sin(2\pi f_0 t + \varphi_0) \qquad \text{Equation 1}$$

In Equation 1 (Eq. 1), t is time, r(t) is the signal 202 waveform as a function of time t, $f_0$ is a frequency of the carrier signal, $\varphi_0$ is a phase shift of the signal 202, $d_k$ is a first input signal (a first data signal), and $q_k$ is a second input signal (a second data signal). The Costas loop 200 is a phase lock loop (PLL) that locks to the frequency $f_0$ and phase shift $\varphi_0$ of the carrier signal.

In quadrature amplitude modulation, the carrier signal is modulated with two input signals to produce two frequency components that are orthogonal to each other, with each frequency component corresponding to one of the input signals. Accordingly, the two frequency components are 90° out of phase with each other. As shown in Eq. 1, the carrier signal is modulated with the first input signal $d_k$ to produce a first frequency component $d_k \cos(2\pi f_0 t)$ (an in-phase component); and the carrier signal is modulated with the second input signal $q_k$ to produce a second frequency component $q_k \sin(2\pi f_0 t)$ (a quadrature component) that is phase shifted 90° with respect to the first frequency component. The two frequency components are added together to produce a transmitted signal. The transmitted signal is then received by a receiver as the signal 202 (which is phase shifted with respect to the original transmitted signal due to, for example, transmission time). Orthogonality of the frequency components of the signal 202 enables the input signals to be separately recovered after the signal 202 is received. To recover the input signals, the receiver determines the frequency of the carrier signal $f_0$.

In the Costas loop 200, the two data components are required to have the same data rate to enable carrier frequency recovery.

Eq. 2 represents a signal $x_I(t)$ at an output node 228 of the first low pass filter 212, and Eq. 3 represents a signal $x_Q(t)$ at an output node 230 of the second low pass filter 214:

$$x_I(t) = d_k \cos(2\pi \Delta F t + \Delta\varphi) - q_k \sin(2\pi \Delta F t + \Delta\varphi) \quad \text{Equation 2}$$

$$x_Q(t) = d_k \sin(2\pi \Delta F t + \Delta\varphi) + q_k \cos(2\pi \Delta F t + \Delta\varphi) \quad \text{Equation 3}$$

In Eqs. 2 and 3, $\Delta F = f_0 - f_{LO}$ ($f_{Lo}$ is the frequency of the local oscillator, which is the frequency of the VCO 208) and $\Delta\varphi = \varphi_0 - \varphi_{LO}$ ($\varphi_{LO}$ is the phase shift of the local oscillator, which is the phase shift of the VCO 208). After $\Delta F = 0$ and $\Delta\varphi = 0$, the Costas loop 200 has locked to the frequency $f_0$ of the carrier signal and the phase shift $\varphi_0$ of the signal 202. Accordingly, the VCO 208 outputs a waveform of frequency $f_{LO} \approx f_0$ and phase shift $\varphi_{LO} \approx \varphi_0$, so that $\Delta F \approx 0$ and $\Delta\varphi \approx 0$. When this is true, Eq. 2 resolves to $x_I(t) \approx d_k$ and Eq. 3 resolves to $x_Q(t) \approx q_k$ (because $\cos(0) = 1$ and $\sin(0) = 0$), recovering the initial input signals (data signals). Another result is that an output node 232 of the first limit amplifier 216 corresponds to $\text{sgn}(d_k)$ and an output node 234 of the second limit amplifier 220 corresponds to $\text{sgn}(q_k)$. (Sgn(x) is the sign function, which extracts the sign of the input.)

The limit amplifiers limit the amplitude of the baseband signals, accordingly providing the sgn(x) function. The third multiplier 218 multiplies $x_I(t)$ by sgn ($x_Q(t)$), and the fourth multiplier 222 multiplies $x_Q(t)$ by sgn($x_I(t)$). The output of the third multiplier 218 can be represented as shown in Equation 4. The output of the fourth multiplier 222 can be represented as shown in Equation 5. These two outputs are subtracted in the adder 224. The resulting error signal, when the VCO 208 is near or at a locking state of the Costas loop 200, can be simplified (considering $x \cdot \text{sgn}(x) = |x|$) to produce Equation 6.

$$[d_k \cos(2\pi \Delta F t + \Delta\varphi) - q_k \sin(2\pi \Delta F t + \Delta\varphi)] \cdot \text{sgn}(d_k \sin(2\pi \alpha F t + \Delta\varphi) + q_k \cos(2\pi \Delta F t + \Delta\varphi)) \quad \text{Equation 4}$$

$$[d_k \sin(2\pi \Delta F t + \Delta\varphi) + q_k \cos(2\pi \Delta F t + \Delta\varphi)] \cdot \text{sgn}(d_k \cos(2\pi \Delta F t + \Delta\varphi) - q_k \sin(2\pi \Delta F t + \Delta\varphi)) \quad \text{Equation 5}$$

$$2|d_k|\sin(2\pi \Delta F\, t + \Delta\phi) \quad \text{Equation 6}$$

The error signal (as shown in Equation 6) is filtered by the loop filter 226 and connected to control the VCO 208.

SUMMARY

In described examples, a method of operating a transceiver with a transmitter and a receiver includes generating a frequency reference. In the transmitter: A phase locked loop (PLL) generates a first voltage controlled oscillator (VCO) control voltage in response to the frequency reference. A VCO in the transmitter generates a transmitter VCO signal in response to the first VCO control voltage, and the PLL is locked to the transmitter VCO signal. In the receiver: A signal is received. A receiver VCO generates a receiver VCO signal in response to the first or a second VCO control voltage. The receiver VCO signal is multiplied by the received signal to generate an I component, and by the received signal phase shifted by 90° to generate a Q component. The second VCO control signal is generated in response to the I component and the Q component.

DETAILED DESCRIPTION

Multiple related approaches, which can be combined in potentially synergistic ways, are described hereinbelow in Sections I and II, whose titles are not limiting. Section I relates to using a receiver to recover a "leaky carrier" added to an in-phase (I) or quadrature (Q) component of a transmitted quadrature amplitude modulation (QAM) signal to enable carrier recovery when different data rate input signals are used. Section II relates to using a single respective phase locked loop (PLL) for both a transmitter and a receiver in each transceiver of a communicating pair of transceivers; accordingly, the single PLL is used both to generate a carrier signal for transmission, and to recover a carrier signal in a received signal.

Section I. Carrier Recovery Using a Leaky Carrier

Figure 1:
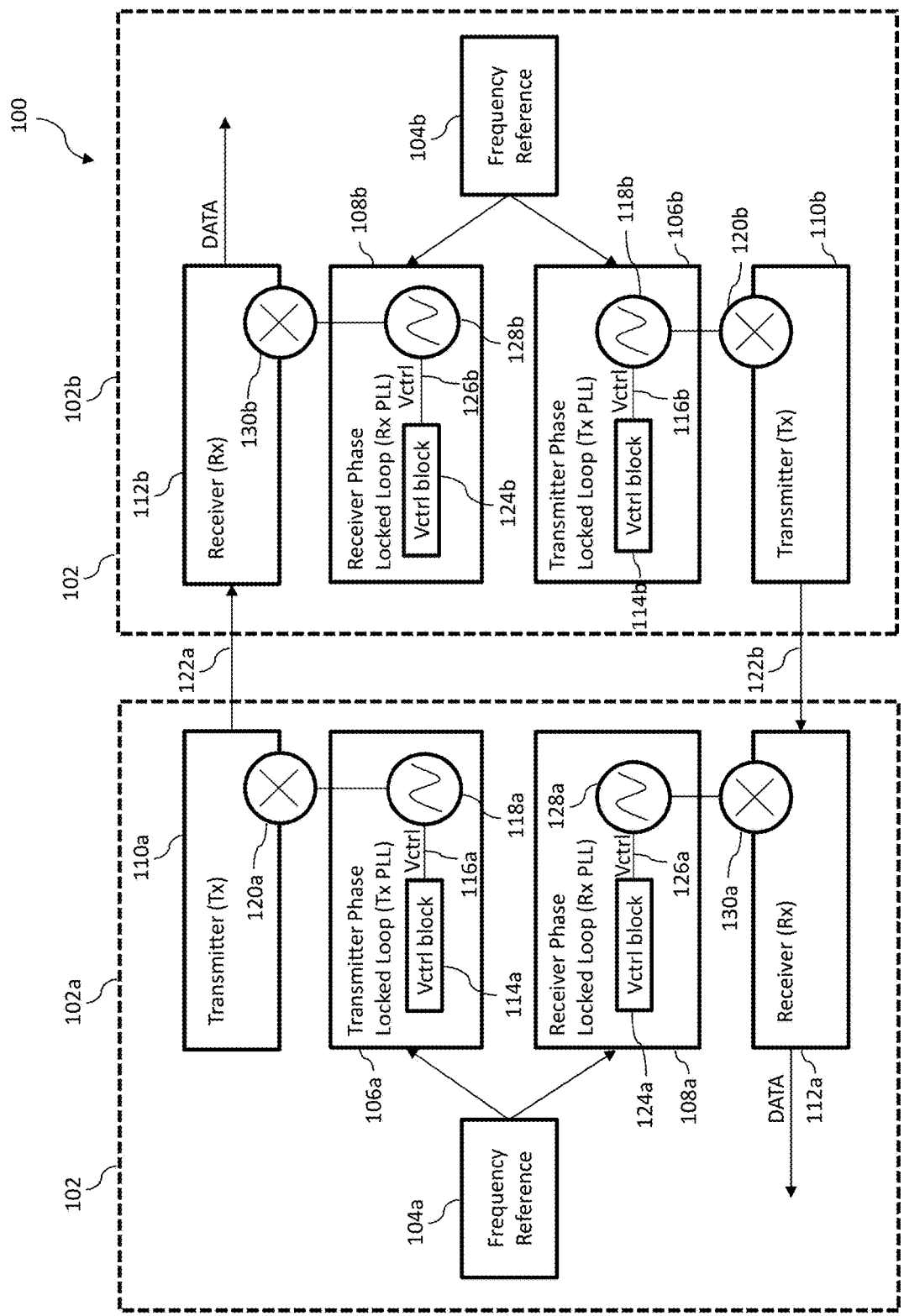
FIG. 1 (prior art) shows an example of a functional block layout of a transceiver (transmitter/receiver) system.
Figure 2:
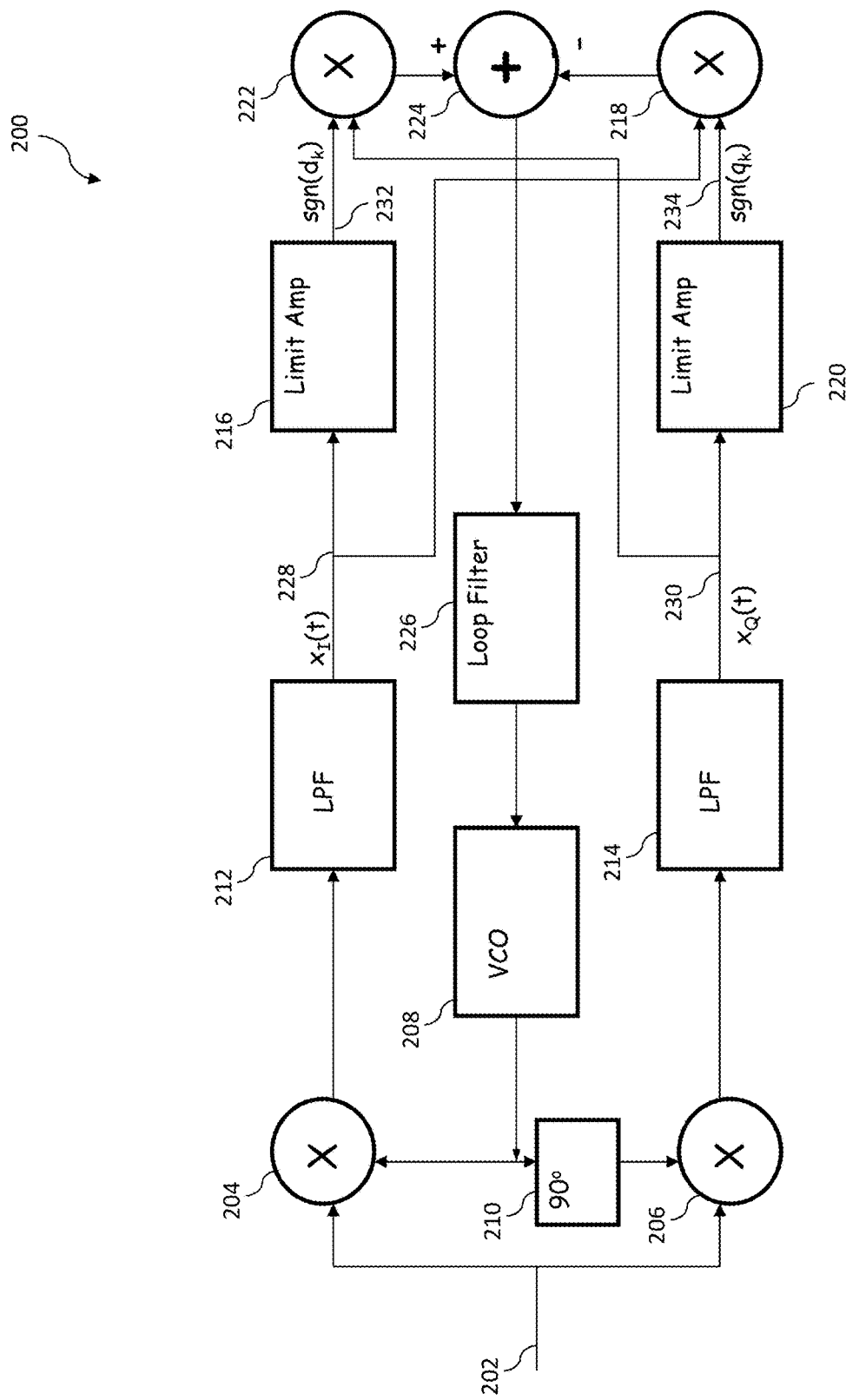
FIG. 2 (prior art) shows an example of a functional block layout of a Costas loop.
Figure 3:
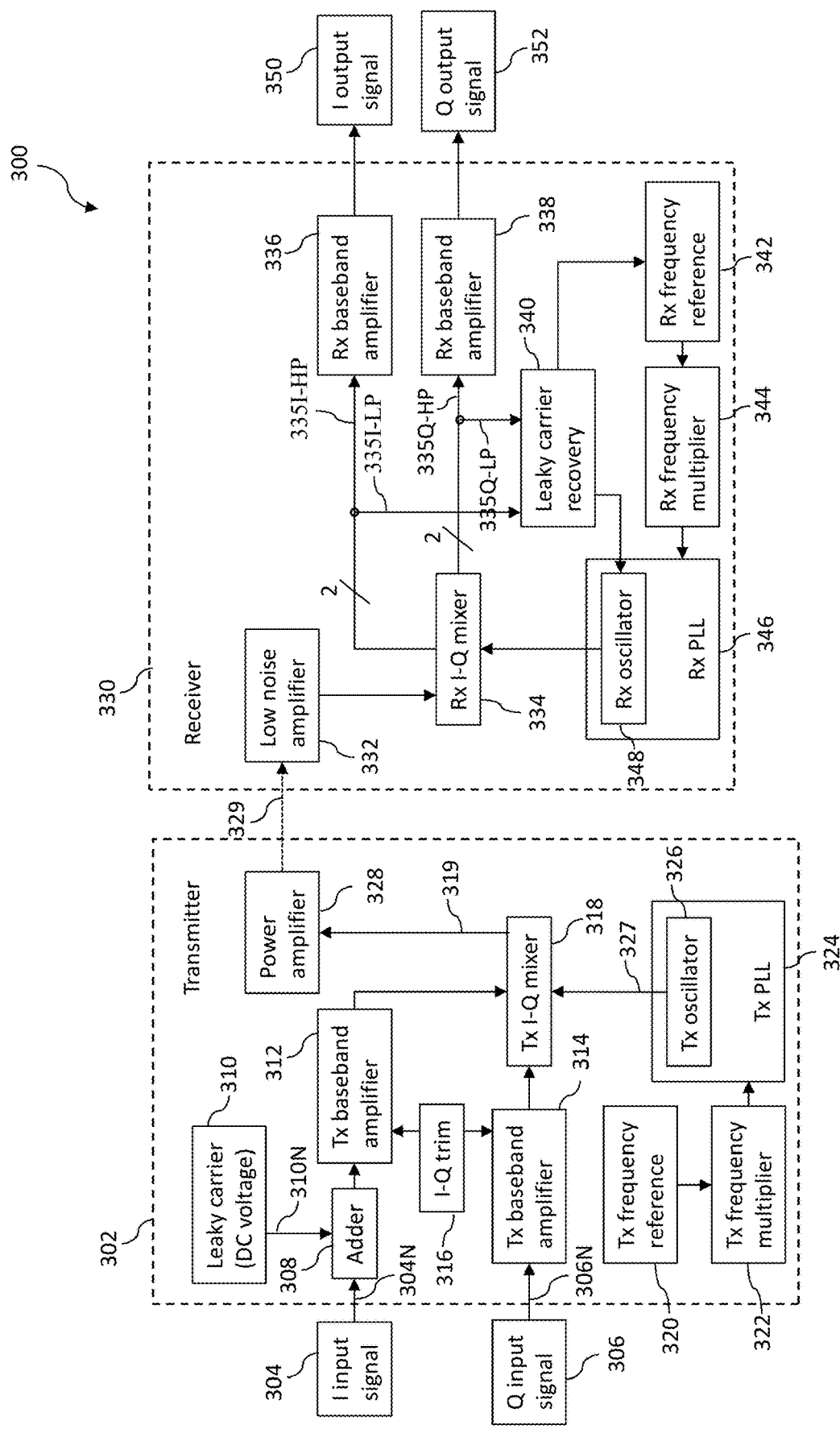
FIG. 3 shows an example of a functional block layout of a transceiver (transmitter/receiver) system using a leaky carrier signal.

FIG. 3 shows an example of a functional block layout of a transceiver (transmitter/receiver) system 300 using a leaky carrier signal 310. By way of introduction, the leaky carrier signal 310 facilitates proper frequency and phase synchronization between a system 300 transmitter 302 (Tx) and a system 300 receiver 330 (Rx), including an accommodation for a phase shift that occurs when a modulated carrier signal is transmitted between the transmitter 302 and the receiver 330. Further, the leaky carrier signal 310 will support data communication of two independent data streams, at different frequencies.

As shown in FIG. 3, the transmitter 302 receives an I input signal 304 including a data signal $d_k$ from an I input signal node 304N and a Q input signal 306 including a data signal $q_k$ from a Q input signal node 306N. The Q input signal 306 (the quadrature input signal) is received with a 90 degree (90°) phase shift with respect to the I input signal 304 (the in phase input signal). An adder 308 receives the I input signal 304 from the I input signal node, and a leaky carrier signal 310 from a leaky carrier signal node 310N, as inputs. (The adder 308 can alternatively receive the Q input signal 306 and the leaky carrier signal 310 as inputs.) The leaky carrier signal 310 is a direct current (DC) signal. This DC signal is a constant current, $I_{DC}$, which can also be described as a constant voltage, $V_{DC}$. The leaky carrier signal 310 is so named because it causes the Tx I-Q mixer 318 to preserve an unmodulated carrier signal component in the modulated carrier signal 319, which is amplified to produce the transmitter output signal 329. Typically, unmodulated carrier signal components are reduced or eliminated prior to transmission to improve transmitter power efficiency. However, in the transmitter system 300, the receiver 330 uses the unmodulated carrier signal component to facilitate carrier signal recovery.

Figure 4:
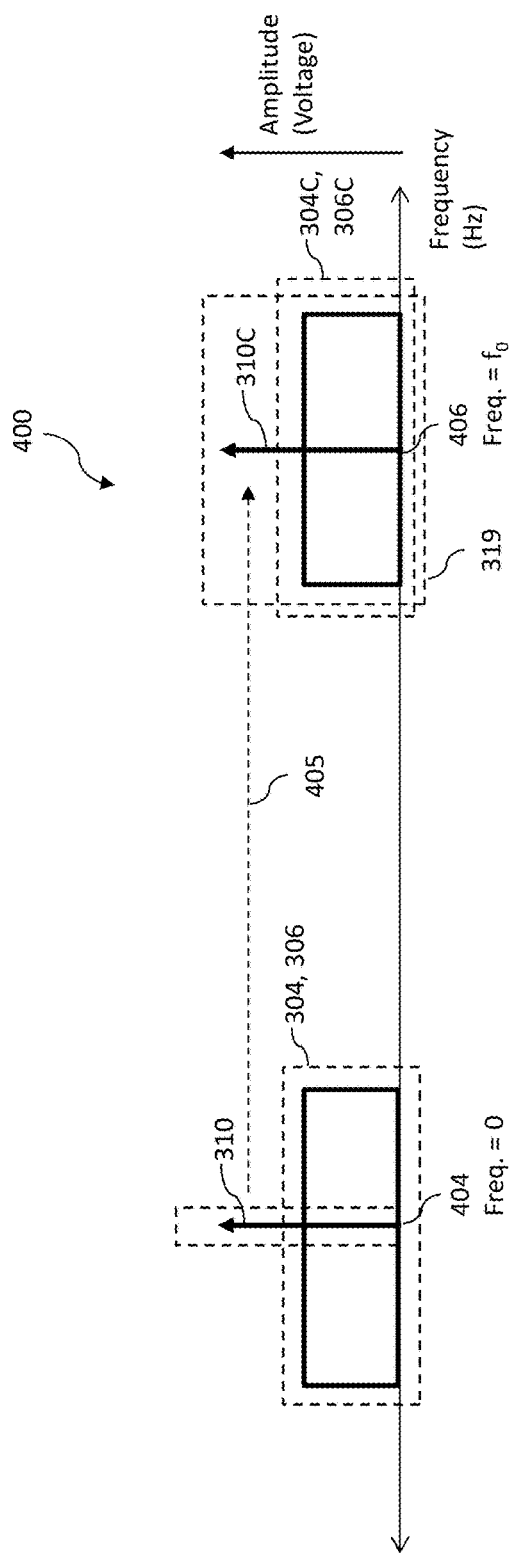
FIG. 4 shows an example graph of frequency against amplitude for the input signals, leaky carrier signal, and resulting modulated carrier signal.

For example, 10% of the available transmission power can be allocated to the leaky carrier. FIG. 4 shows an example illustration of the total spectral content of the signal at the output of the Tx I-Q mixer 318. FIG. 4 is further described below. The signal output by the transmitter 302 will generally have three DC components, corresponding to contributions from the leaky carrier signal 310, the I input signal 304, and the Q input signal 306. For purposes of recovery of the carrier signal frequency by the receiver 330 using the DC component contributed by the leaky carrier signal 310, the DC contributions of the I and Q input signals 304, 306 can be thought of as error signals. Accordingly, the amplitude of the leaky carrier signal 310 is larger than the amplitude of the DC components of the I and Q input signals 304, 306 (for example, 10-20 dB larger).

The adder 308 is connected to output to a first Tx baseband amplifier 312. The Q input signal node 306 is connected to an input of a second Tx baseband amplifier 314. An I-Q trim block 316 is connected to output to the first and second Tx baseband amplifiers 312, 314. The I-Q trim block 316 corrects amplitude and phase mismatches between the I input signal and the Q input signal as amplified by the first and second Tx baseband amplifiers 312, 314. The first and second Tx baseband amplifiers 312, 314 are connected to output to a Tx I-Q mixer 318.

A highly accurate Tx frequency reference 320, such as an oscillator using a bulk acoustic wave (BAW) filter, is connected to output to a Tx frequency multiplier 322. A receiver 330 (further discussed below) includes a Rx frequency reference 342 (a receiver frequency reference, further described below) that matches the Tx frequency reference 320 in design and reference output signal frequency. Accordingly, the Tx frequency reference 320 and the Rx frequency reference 342 are nominally configured to output their respective reference signals within a sufficiently narrow tolerance range, whereby a Rx PLL 346 (a receiver phase locked loop, further described below) initially operated at the frequency of the Rx frequency reference 342 will eventually lock to the Tx frequency reference 320. (An acquisition time—a time to lock is generally determined by carrier recovery loop dynamics. For example, wider loop bandwidth generally facilitates faster lock.) Accordingly, because the Tx frequency reference 320 and the Rx frequency reference 342 are matched (in design and, within tolerances, output frequency), this can also be viewed as the frequency references 320, 342 being configured to output their respective reference signals with a sufficiently narrow tolerance range for the respective reference frequencies that if (for example) a PLL 324 or 346 (the Tx PLL 324 or the Rx PLL 346) was operated at a first frequency at a first end of the tolerance range, and a second frequency at a second end of the tolerance range was input into the PLL 324 or 346, the PLL 324 or 346 would lock to the second frequency. For example, the Tx frequency reference 320 and the Rx frequency reference 342 may be accurate to within a few hundred parts per million of a specified frequency at frequencies of a few GHz. Accordingly, the Tx frequency reference 320 and the Rx frequency reference 342 can be made identical (or nearly identical) by using the same design for both the Tx and Rx frequency references 320, 342 (though there will generally be some difference due to, for example, process variations and differences in operating conditions).

The Tx frequency multiplier 322 multiplies the frequency of the waveform output by the Tx frequency reference 320 by a specified factor N, a positive real number (typically determined by a frequency divider in the PLL loop, not shown). For example, the Tx frequency reference 320 can be a 2.5 GHz reference, which the Tx frequency reference 320 multiplies by a factor N=50 to produce an output signal with a frequency F=125 GHz. The Tx frequency multiplier 322 output signal is connected to the Tx phase locked loop 324 (PLL), which locks to the frequency of the Tx frequency multiplier 322 output signal. The Tx PLL 324 includes a Tx oscillator 326 (a VCO). The Tx PLL 324 locks, by controlling its oscillator 326, to the phase and frequency of the Tx frequency multiplier 322 output signal. The Tx oscillator 326 outputs a PLL output signal, corresponding to the frequency and phase at which the Tx PLL 324 locks. The Tx oscillator 326 output signal is used as a carrier signal by the transmitter 302, and is referred to herein as the carrier signal 327. The Tx oscillator 326 output signal is connected to the Tx I-Q mixer 318. The Tx I-Q mixer 318 outputs a modulated carrier 319 that contains what may be considered three components. For the first two components, the Tx I-Q mixer 318 multiplies the I input signal 304 plus the leaky carrier signal 310, as received from the Tx baseband amplifier 312, with the Tx oscillator 326 output signal (the carrier signal 327) to produce a respective I component and leaky carrier component. For the third component, the Tx I-Q mixer 318 multiplies the Q input signal 306 with the carrier signal, with a 90° phase shift applied to the carrier signal, to produce a Q component. The Tx I-Q mixer 318 adds the I component, the leaky carrier component, and the Q component together to produce a modulated carrier signal 319 (further described with respect to FIG. 4). The modulated carrier signal 319 can be represented as:

$$Tx(t) = d_k \cos(2\pi f_0 t) + q_k \sin(2\pi f_0 t) + V_{DC} \cos(2\pi f_0 t) \qquad \text{Equation 7}$$

In Eq. 7, t is time,

Tx(t) is the modulated carrier signal 319 waveform as a function of time t, $f_0$ is the frequency of the carrier signal, $d_k \cos(2\pi f_0 t)$ is the I component, $q_k \sin(2\pi f_0 t)$ is the Q component, and $V_{DC} \cos(2\pi f_0 t)$ is the leaky carrier component.

Generally, the multiplication performed by the Tx I-Q mixer 318 suppresses (substantially reduces or cancels out) unmodulated components of the carrier signal. That is, the Tx I-Q mixer 318 lowers the energy of unmodulated carrier signal components (components which do not correspond to the carrier signal modulated by a data signal) toward zero. This is done, for example, to improve the dynamic range of the transmitter 302, which typically has a fixed, limited power budget. However, including the leaky carrier signal 310 results in an unsuppressed carrier signal component on the I channel (the transmission channel in phase with the I input signal component): the leaky carrier component. The in-phase component (I component) of the modulated carrier signal 319 can be represented as $d_k \cos(2\pi f_0 t) + V_{DC} \cos(2\pi f_0 t)$, and the quadrature component (Q component) of the modulated carrier signal 319 can be represented as $q_k \sin(2\pi f_0 t)$. The Tx I-Q mixer 318 outputs the modulated carrier signal 319 to a power amplifier 328. The transmitter 302 transmits the output of the power amplifier 328, as a Tx output signal 329, to a receiver 330. Generally, transmission is performed using transmission structure, such as an antenna or cable.

FIG. 4 shows an example graph 400 of frequency against amplitude for the input signals 304, 306, leaky carrier signal 310, and resulting modulated carrier signal 319. The leaky carrier signal 310 is a DC voltage, meaning zero frequency ($f(V_{DC})=0$). The I input signal 304 and Q input signal 306 occupy frequency bands around the leaky carrier signal 310 at a zero frequency 404. When the I and Q input signals 304, 306 and the leaky carrier signal 310 are multiplied by the Tx I-Q mixer 318 with the carrier signal 327, they are frequency-translated 405 so as to form component counterparts that are re-located to a frequency position at or near the frequency of the carrier signal 327, shown in FIG. 4 as frequency 406 ($f_0$, the Tx oscillator 326 frequency). Accordingly, the modulated carrier signal 319 is shown to include the leaky carrier component 310C at the frequency 406, and within a bandwidth about the leaky carrier component 310C are included the I component 304C and the Q component 306C.

Returning to FIG. 3, the modulated carrier signal 319 output by the Tx I-Q mixer 318 is amplified by a power amplifier 328 and then transmitted to the receiver 330 as Tx output signal 329. The Tx output signal 329 is received in the receiver 330 by a low noise amplifier 332 as a Rx input signal. The Rx input signal is phase shifted from the Tx output signal 329 due to transit time between the transmitter 302 and the receiver 330. The Rx input signal can be represented as:

$$Rx(t) = d_k \cos(2\pi f_0 t + \varphi_0) + q_k \sin(2\pi f_0 t + \varphi_0) + V_{DC} \cos(2\pi f_0 t + \varphi_0) \quad \text{Equation 8}$$

In Eq. 8, and as also appreciated by contrasting it with the expression of Tx(t) shown in Eq. 7, $\varphi_0$ represents the phase shift from Tx(t) to Rx(t). The low noise amplifier 332 is connected to output the (amplified) Rx input signal to a Rx I-Q mixer 334. The Rx I-Q mixer 334 outputs a high pass filtered I component 335I-HP to a first Rx baseband amplifier 338, and outputs a high pass filtered Q component 335Q-HP to a second Rx baseband amplifier 338. The Rx I-Q mixer 334 also outputs a low pass filtered I component 335I-LP and a low pass filtered Q component 335Q-LP to a leaky carrier recovery block 340.

The leaky carrier recovery block 340 is connected to output a voltage control signal to a tunable, highly accurate Rx frequency reference 342, such as an oscillator using a BAW filter. The leaky carrier recovery block 340 is also connected to output a voltage control signal to a Rx oscillator 348 (a VCO). The Rx frequency reference 342 may be accurate, for example, within a few parts per million of a specified frequency at frequencies of a few GHz. As introduced earlier, the Rx frequency reference 342 provides a timing signal for the receiver 330, which has a frequency close enough to the frequency of the transmitter 302 Tx frequency reference 320 output signal to enable the Rx PLL 346 to lock. Accordingly, the frequency of the Rx frequency reference 342 output signal is specified to equal (accordingly, because of device tolerances, be close to) the frequency of the Tx frequency reference 320 output signal used to generate the carrier signal 327 for the transmitter 302. The voltage control signals output by the leaky carrier recovery block 340 tune the Rx frequency reference 342, or the Rx oscillator 348, or both, until the output of the Rx PLL 346 matches the frequency and phase of the transmitter carrier signal 327, phase shifted by $\varphi_0$.

The Rx frequency reference 342 is connected to output a Rx frequency reference signal to a Rx frequency multiplier 344. The Rx frequency multiplier 344 multiplies the Rx frequency reference signal by the same factor (N) used by the Tx frequency multiplier 322. The Rx frequency multiplier 344 is connected to output to a Rx PLL 346 that includes the Rx oscillator 348. The Rx PLL 346 Rx oscillator 348 locks to the frequency and phase of the waveform output by the Rx frequency multiplier 344, as tuned by the voltage control signals output by the leaky carrier recovery block 340. Once the Rx PLL 346 stabilizes (locks)—and accordingly, the waveform output by the Rx oscillator 348 stabilizes—the Rx oscillator 348 produces a signal with frequency $f_0$ and phase shift $\varphi_0$, corresponding to the carrier signal 327 with phase shift $\varphi_0$. The Rx oscillator 348 is connected to output to the Rx I-Q mixer 334.

Figure 5:
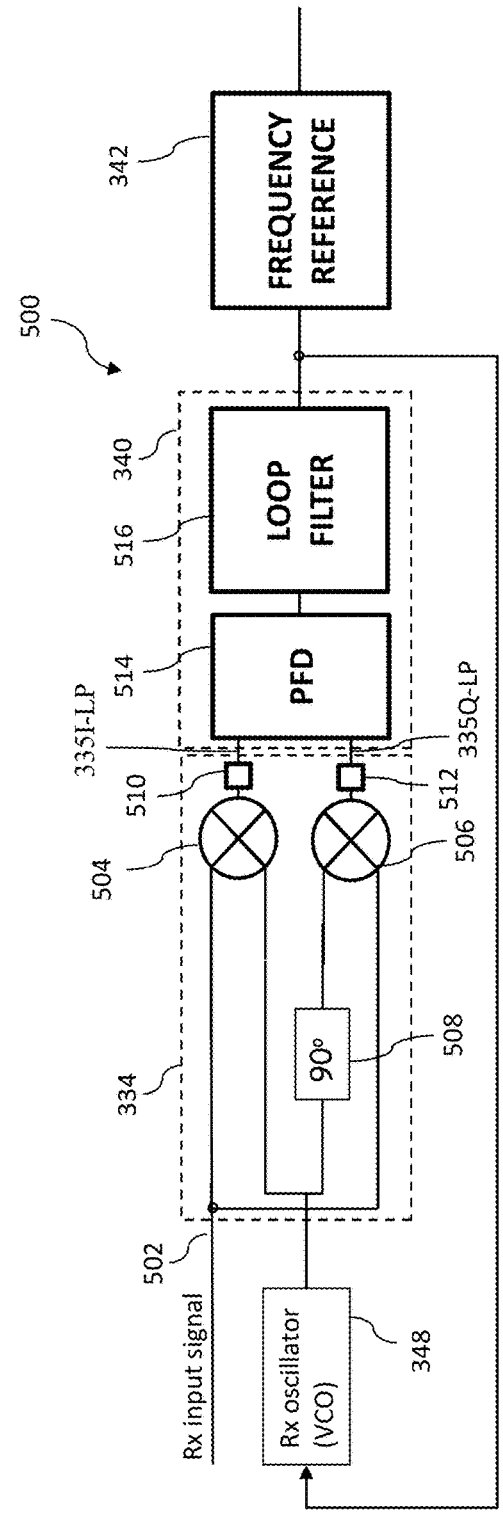
FIG. 5 shows an example of a functional block layout of the Rx oscillator, the Rx I-Q mixer, and the leaky carrier recovery block, all from the receiver in FIG. 3.

FIG. 5 shows an example of a functional block layout 500 of the Rx oscillator 348, the Rx I-Q mixer 334, and the leaky carrier recovery block 340, all from the receiver 330 in FIG. 3. The Rx oscillator 348 is connected to output to the Rx I-Q mixer 334. The Rx I-Q mixer 334 is connected to receive the Rx input signal 502 (Rx(t), see Eq. 8 above) from the low noise amplifier 332 (see FIG. 3). And, as now demonstrated, the Rx I-Q mixer 334 shifts the frequency domain of Rx(t) to remove the carrier signal, essentially shifting the components of the Tx output signal 329 shown to the right in FIG. 4 back to the original inputs (Q, I, and leaky carrier) shown to the left in FIG. 4.

The Rx input signal 502 is connected as a first input to a first mixer multiplier 504 and as a first input to a second mixer multiplier 506. The Rx oscillator 348 output is connected as a second input to the first mixer multiplier 504 and as an input to a 90° phase shifter 508. The 90° phase shifter 508 phase shifts the Rx oscillator 348 output by 90°, and is connected to output the resulting signal as a second input to the second mixer multiplier 506.

The first mixer multiplier 504 multiplies the Rx input signal (Rx(t)) by the output of the Rx oscillator 348, and the second mixer multiplier 506 multiplies Rx(t) by a 90° phase shifted version of the output of the Rx oscillator 348. Collectively, therefore, the first and second mixer multipliers output a signal representative of an approximation of the three original transmitter signals, namely, the I input signal 304, the leaky carrier signal 310, and the Q input signal 306, all phase shifted by $\varphi_0$. Further, this approximation becomes closer as the Rx oscillator 348 output converges towards the transmitter carrier signal 327. The first mixer multiplier 504 is connected to output to a first mixer low pass filter 510, and the second mixer multiplier 506 is connected to output to a second mixer low pass filter 512. The output of the first mixer low pass filter 510 is low pass filtered I component 335I-LP, and the output of the second mixer low pass filter 512 is low pass filtered Q component 335Q-LP. (The Rx I-Q mixer 334, as shown in FIG. 5, does not show the high pass filters used to generate the high pass filtered I and Q components 335I-HP and 335Q-HP.) The signals output by the low pass filters 510, 512 each include a leaky carrier signal component.

The first mixer low pass filter 510 output and the second mixer low pass filter 512 output are connected as first and second inputs to a phase frequency detector 514 (PFD) in the leaky carrier recovery block 340. The PFD 514 uses a differential between first and second mixer low pass filter 510, 512 outputs to determine a frequency difference (also corresponding to a phase difference) between the Rx oscillator 348 output and the carrier signal 327. The PFD 514 is connected to output to a loop filter 516, which is connected to control inputs to tune (one or both of) the Rx frequency reference 342 and Rx oscillator 348 outputs. Accordingly, the PFD 514 and loop filter 516 together use the low pass filtered I and Q components 335I-LP, 335Q-LP as feedback to produce control voltages to tune the Rx frequency reference 342 and Rx oscillator 348 outputs. When the frequency (and phase) difference is zero, the PFD 514 and loop filter 516 maintain the Rx frequency reference 342 and Rx oscillator 348 outputs so as to maintain the zero frequency (and phase) difference. (Small, deliberate amounts of variation may be introduced to facilitate the PFD 514 and loop filter 516 compensating for drifting of the locked frequency and phase.) Once the Rx PLL 346 locks, the output of the Rx oscillator 348 corresponds to the carrier signal 327, phase shifted by $\varphi_0$.

The recovered carrier signal enables recovery of the I input signal 304 ($d_k$) and the Q input signal 306 ($q_k$). The resulting I component, $x_I(t)$, and the resulting Q component, $x_Q(t)$, can be represented as follows:

$$x_I(t) = d_k \cos(2\pi\Delta Ft + \Delta\varphi) - q_k \sin(2\pi\Delta Ft + \Delta\varphi) + DC \cos(2\pi\Delta Ft + \Delta\varphi) \quad \text{Equation 9}$$

$$x_Q(t) = d_k \sin(2\pi\Delta Ft + \Delta\varphi) + q_k \cos(2\pi\Delta Ft + \Delta\varphi) + DC \sin(2\pi\Delta Ft + \Delta\varphi) \quad \text{Equation 10}$$

In FIG. 3, $x_I(t)$ corresponds to 335I-HP, and $x_Q(t)$ corresponds to 335Q-HP.

In Eqs. 9 and 10, $\Delta F = f_0 - f_{LO}$ ($f_{LO}$ is the frequency of the local oscillator, which is the frequency of the Rx oscillator 348) and $\Delta\varphi = \varphi_0 - \varphi_{LO}$ ($\varphi_{LO}$ is the phase shift of the local oscillator, which is the phase shift of the Rx oscillator 348 with respect to the Tx output signal 329). When $\Delta F = 0$ and $\Delta\varphi = 0$, the Rx PLL 346 has locked to the frequency $f_0$ of the carrier signal and the phase shift $\varphi_0$ of the Rx input signal. Accordingly, the Rx oscillator 348 outputs a waveform of frequency $f_{LO} \approx f_0$ and phase shift $\varphi_{LO} \approx \varphi_0$, so that $\Delta F \approx 0$ and $\Delta\varphi \approx 0$. When this is true, Eq. 9 resolves to $x_I(t) \approx d_k$ and Eq. 10 resolves to $x_Q(t) \approx q_k$ (because $\cos(0) = 1$ and $\sin(0) = 0$). This means that, after the Rx PLL 346 has locked to frequency $f_0$ and phase shift $\varphi_0$, the $x_I(t)$ and $x_Q(t)$ values (available at respective nodes (not shown) in the Rx PLL 346) respectively correspond to the recovered initial I input signal 304 ($d_k$) and Q input signal 306 ($q_k$), phase shifted by $\varphi_0$.

Accordingly, when the Rx oscillator 348 produces a signal with frequency $f_0$ and phase shift $\varphi_0$, the high pass filtered I component 335I-HP output by the Rx I-Q mixer 334 includes a recovered I input signal 304 ($d_k$), and the high pass filtered Q component 335Q-HP output by the Rx I-Q mixer 334 includes a recovered Q input signal 306 ($q_k$). The recovered I input signal 304 is amplified by the first Rx baseband amplifier 336 to produce an I output signal 350. The recovered Q input signal 306 is amplified by the second Rx baseband amplifier 338 to produce a Q output signal 352. The I output signal 350 and Q output signal 352 are outputs of the receiver 330.

The leaky carrier signal causes the transmitter output to retain an unmodulated carrier signal component (a leaky carrier component). The unmodulated carrier signal component enables the receiver 330 to track the transmitted Tx output signal 329—accordingly, to recover the data from the Tx output signal 329—without using an external frequency reference. The leaky carrier component of the Rx input signal enables the Rx PLL 346 to lock to the carrier signal's 327 frequency and phase (as phase shifted by transmission from the transmitter 302 to the receiver 330) when the I input signal 304 and the Q input signal 306 are generated using different encoding standards; for example, using different data rates and/or different signal frequencies.

Figure 6A:
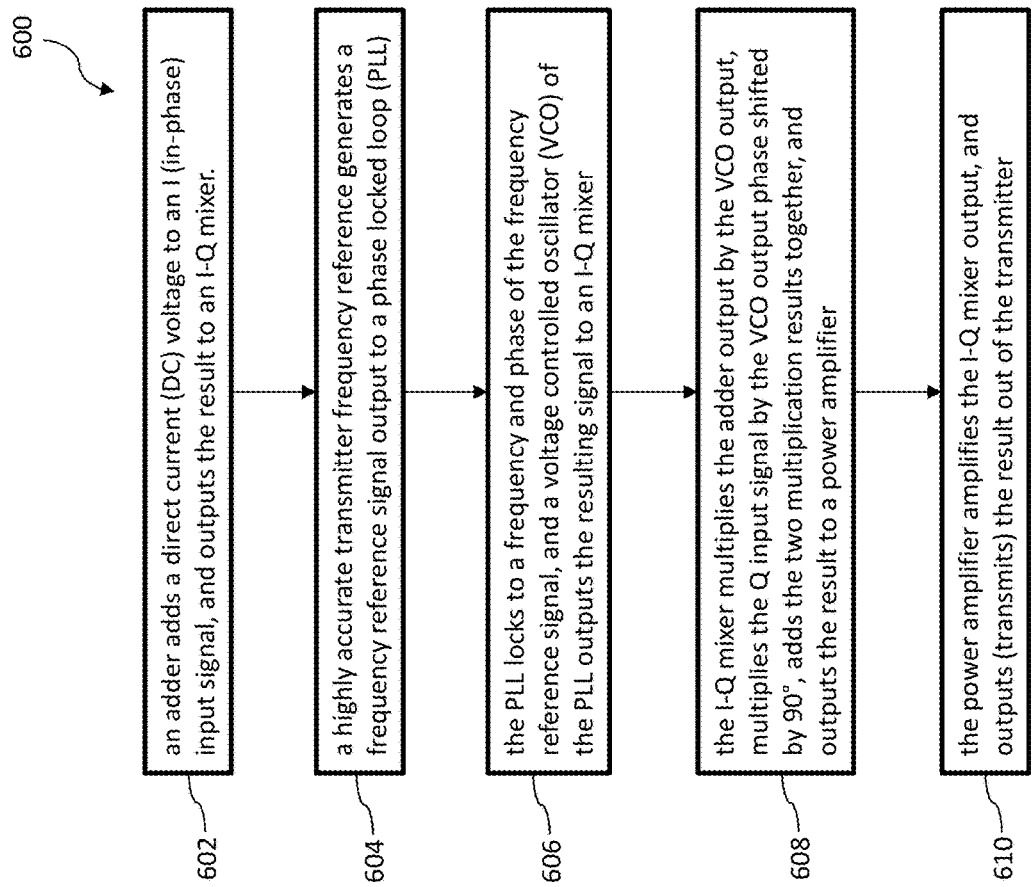
FIG. 6A shows an example process for transmitting a quadrature amplitude modulated (QAM) signal from a transmitter.

FIG. 6A shows an example process 600 for transmitting a quadrature amplitude modulated (QAM) signal from a transmitter. In step 602, an adder adds a direct current (DC) voltage to an I (in-phase) input signal, and outputs the result to an I-Q mixer. In step 604, a highly accurate transmitter frequency reference generates a frequency reference signal output to a PLL. In step 606, the PLL locks to a frequency and phase of the frequency reference signal, and a VCO of the PLL outputs the resulting signal to an I-Q mixer. The I-Q mixer receives the adder output, a Q (quadrature) input signal, and the VCO output. In step 608, the I-Q mixer multiplies the adder output by the VCO output, multiplies the Q input signal by the VCO output phase shifted by 90°, adds the two multiplication results together, and outputs the result to a power amplifier. In step 610, the power amplifier amplifies the I-Q mixer output, and outputs (transmits) the result out of the transmitter.

Figure 6B:
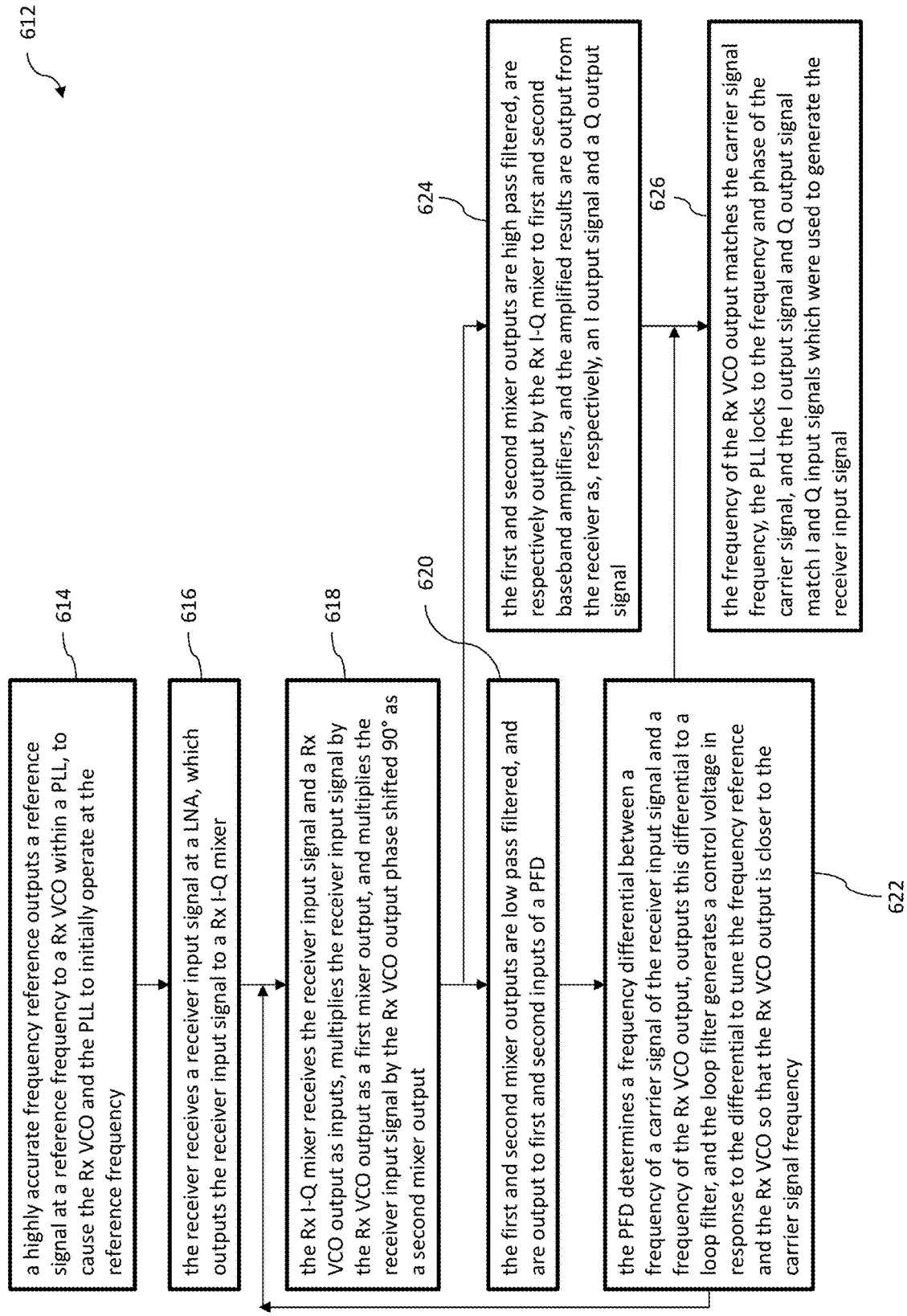
FIG. 6B shows an example process for recovering a carrier signal from a QAM signal at a receiver when the in-phase and quadrature signal components have different data rates.

FIG. 6B shows an example process 612 for recovering a carrier signal from a QAM signal at a receiver when the in-phase and quadrature signal components have different data rates. In step 614, a highly accurate frequency reference outputs a reference signal at a reference frequency to a Rx VCO within a PLL, to cause the Rx VCO and the PLL to initially operate at the reference frequency. In step 616, the receiver receives a receiver input signal (a signal transmitted from a transmitter) at a low noise amplifier (LNA), which outputs the receiver input signal to a Rx I-Q mixer. In step 618, the Rx I-Q mixer receives the receiver input signal and a Rx VCO output (the Rx VCO is part of a Rx PLL) as inputs, multiplies the receiver input signal by the Rx VCO output as a first mixer output (corresponding to an I component of the receiver input signal), and multiplies the receiver input signal by the Rx VCO output phase shifted 90° as a second mixer output (corresponding to a Q component of the receiver input signal). In step 620, the first and second mixer outputs are low pass filtered, and are output to first and second inputs of a PFD. In step 622, the PFD determines a frequency differential between a frequency of a carrier signal of the receiver input signal and a frequency of the Rx VCO output, outputs this differential to a loop filter, and the loop filter generates a control voltage in response to the differential to tune the frequency reference and the Rx VCO so that the Rx VCO output is closer to the carrier signal frequency. Step 622 feeds back to step 618. In step 624, which also depends on step 618 (as step 620 does), the frequency of the Rx VCO output matches the carrier signal frequency, the PLL locks to the frequency and phase of the carrier signal (as phase shifted by transmission), and the I output signal and Q output signal match (with a phase shift) I and Q input signals that were used to generate the receiver input signal. In step 626, which depends on both step 622 and step 624, the first and second mixer outputs are high pass filtered, are respectively output by the Rx I-Q mixer to first and second baseband amplifiers, and the amplified results are output from the receiver as, respectively, an I output signal and a Q output signal.

Section II. Single Phase Locked Loop Transceiver

Figure 7A:
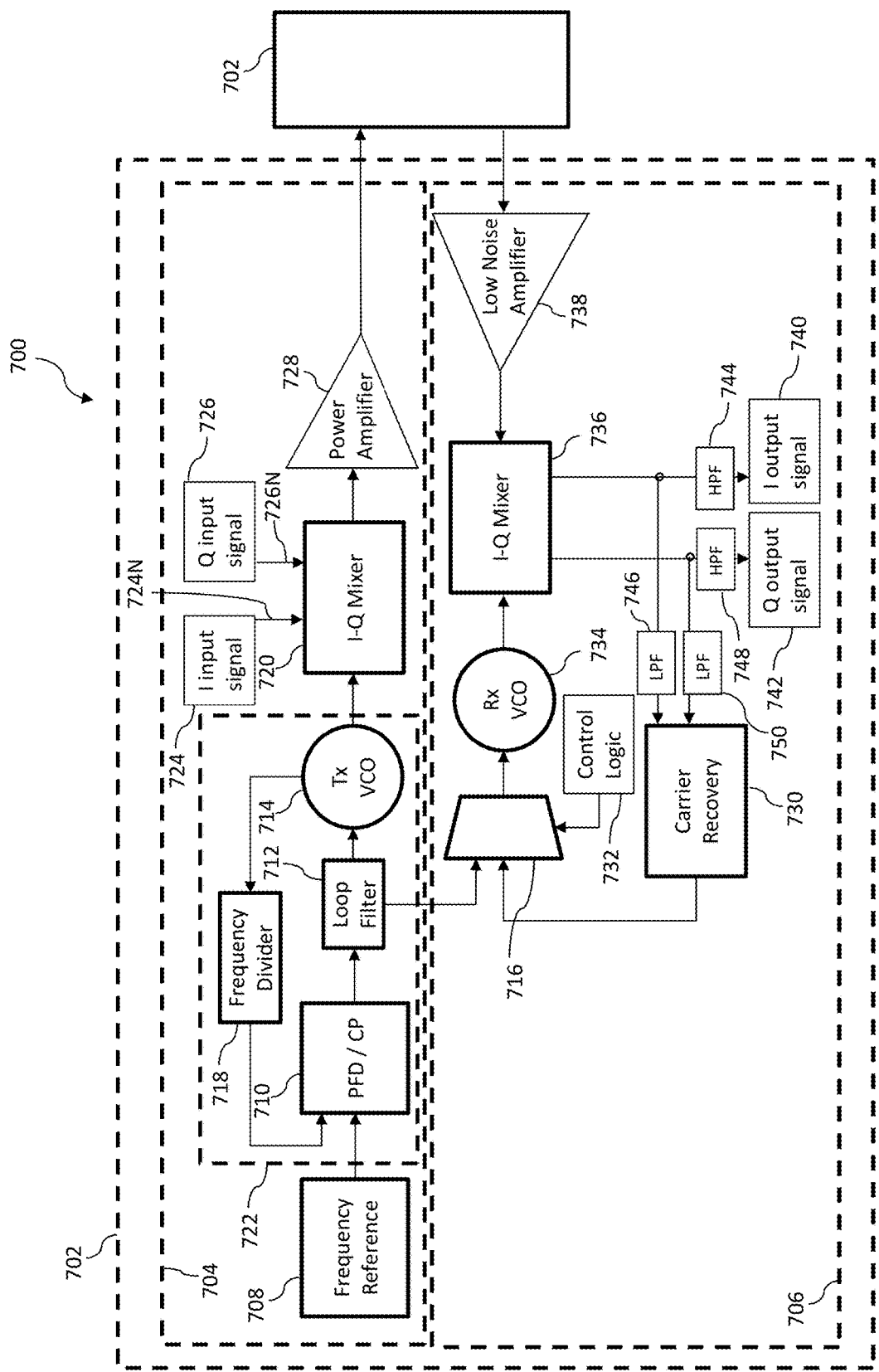
FIG. 7A shows an example of a functional block layout of a transceiver (transmitter/receiver) system.

FIG. 7A shows an example of a functional block layout 700 of a transceiver system 702. A transceiver system 702 on the left of FIG. 7A is connected to communicate with another transceiver system 702 on the right of FIG. 7A. The transceiver system 702 includes a transmitter 704 and a receiver 706. The transmitter 704 includes a transceiver frequency reference 708. The transceiver frequency reference 708 is a highly accurate frequency reference as described with respect to the Tx frequency reference 320 and Rx frequency reference 342 of FIG. 3. The transceiver frequency reference 708 generates a frequency reference signal at a reference frequency. The transceiver frequency reference 708 is connected to output the frequency reference signal to a phase frequency detector/charge pump 710 (PFD/CP 710). The PFD/CP 710 is connected to output to a loop filter 712. The loop filter 712 is connected to output to a transmitter voltage controlled oscillator 714 (Tx VCO 714) and to a first input of a switch 716. The Tx VCO 714 is connected to output to a frequency divider 718 and to a Tx I-Q mixer 720. The frequency divider 718 is connected to output to the PFD/CP 710. The PFD/CP 710, the loop filter 712, the Tx VCO 714, and the frequency divider 718 are part of a phase locked loop 722 (PLL 722).

The PFD/CP 710 determines a differential between the frequency of the transceiver frequency reference 708, and the frequency of the frequency divider 718 output, and outputs the differential to the loop filter 712. The frequency divider 718 divides the frequency of the Tx VCO 714 output by a factor (a number) N and the divided frequency is compared to the frequency reference by the PFD/CP 710. The PFD/CP 710 uses the results of this comparison to generate a control voltage to control the Tx VCO 714. The control voltage is filtered by the loop filter 712, and the filtered control voltage is connected to a control input of the Tx VCO 714. The control voltage tunes the Tx VCO 714, whereby the feedback loop from the Tx VCO 714 to the PFD/CP 710, and the differential inputs of the PFD/CP 710, eventually stabilize the output frequency of the Tx VCO 714 to match N times the frequency reference 708. Accordingly, while the differential input to the PFD/CP 710 is zero, the PLL 722 will be phase locked, and the PFD/CP 710 maintains the Tx VCO 714 output frequency (the control voltage is generated to no longer cause the Tx VCO 714 to change its output frequency). After the PLL 722 phase locks, the Tx VCO 714 output signal is used by the transmitter 704 as a carrier signal, and is used by the receiver 706 to initialize a receiver voltage controlled oscillator 734 (Rx VCO 734).

An I input signal 724 from an I input signal node 724N is connected as a first input of the Tx I-Q mixer 720, and a Q input signal 726 from a Q input signal node 726N is connected as a second input of the Tx I-Q mixer 720. The I-Q mixer 720 multiplies the I input signal 724 by the carrier signal, multiplies the Q input signal 726 by the carrier signal phase shifted by 90°, and adds the two multiplication results together to generate an output of the I-Q mixer 720. The I-Q mixer 720 output is connected to a power amplifier 728. The power amplifier 728 is connected to output from the transceiver 702 (to transmit) to another transceiver 702, such as by physical connection, by directed RF transmission, by broadcast RF transmission, or using guided electromagnetic waves.

The switch 716 is connected to receive an output of the loop filter 712 as a first input, to receive an output of a carrier recovery block 730 (a control voltage) as a second input, and to receive an output of a control logic 732 as a control input. The switch 716 outputs to the Rx VCO 734. The Rx VCO 734 thus receives either the control voltage from the loop filter 712 or the control voltage from the carrier recovery block 730 as an input, and uses the selected control voltage to generate an output signal. The Rx VCO 734 output is connected to a Rx I-Q mixer 736 as a first input of the Rx I-Q mixer 736.

The receiver 706 receives, via a low noise amplifier 738 (LNA 738), a receiver input signal. The receiver input signal is a QAM modulated carrier signal. The LNA 738 output is connected to a second input of the Rx I-Q mixer 736. The Rx I-Q mixer 736 multiplies the Rx VCO 734 output by the receiver input signal, outputs the multiplication result through a first high pass filter 744 as an I output signal 740, and outputs the multiplication result through a first low pass filter 746 as a first input into the carrier recovery block 730. The Rx I-Q mixer 736 multiplies the Rx VCO 734 output phase shifted by 90° by the receiver input signal, outputs the multiplication result through a second high pass filter 748 as a Q output signal 742, and outputs the multiplication result through a low pass filter 750 as a second input into the carrier recovery block 730. The carrier recovery block 730 outputs the resulting control voltage to the second input of the switch 716. The carrier recovery block 730 uses a differential between its first and second inputs to generate the control voltage, which may be selected by the switch to tune the Rx VCO 734 to more closely correspond to the carrier signal of the receiver input signal (for example, as described with respect to the carrier recovery block 340 in FIG. 5). When the frequency of the output of the Rx VCO 734 matches the carrier signal frequency of the receiver input signal, the I output signal 740 matches an I component with which the carrier signal of the receiver input signal was modulated, and the Q output signal 742 matches a Q component with which the carrier signal of the receiver input signal was modulated.

The control logic 732 initially causes the switch 716 to pass the control voltage output by the loop filter 712, which initializes the Rx VCO 734; and not to pass the control voltage output by the carrier recovery block 730. Once the outputs of the Rx VCO 734 and the carrier recovery block 730 have stabilized (for example, after a predetermined amount of time), the control logic 732 causes the switch 716 to pass the control voltage output by the carrier recovery block 730, which tunes the Rx VCO 734 closer to the carrier signal of the receiver input signal; and not to pass the control voltage output by the loop filter 712. The control logic 732 can periodically cause the switch 716 to return to passing the control voltage output by the loop filter 712, to prevent the Rx VCO 734 from drifting, or to reinitialize the Rx VCO 734.

Figure 7B:
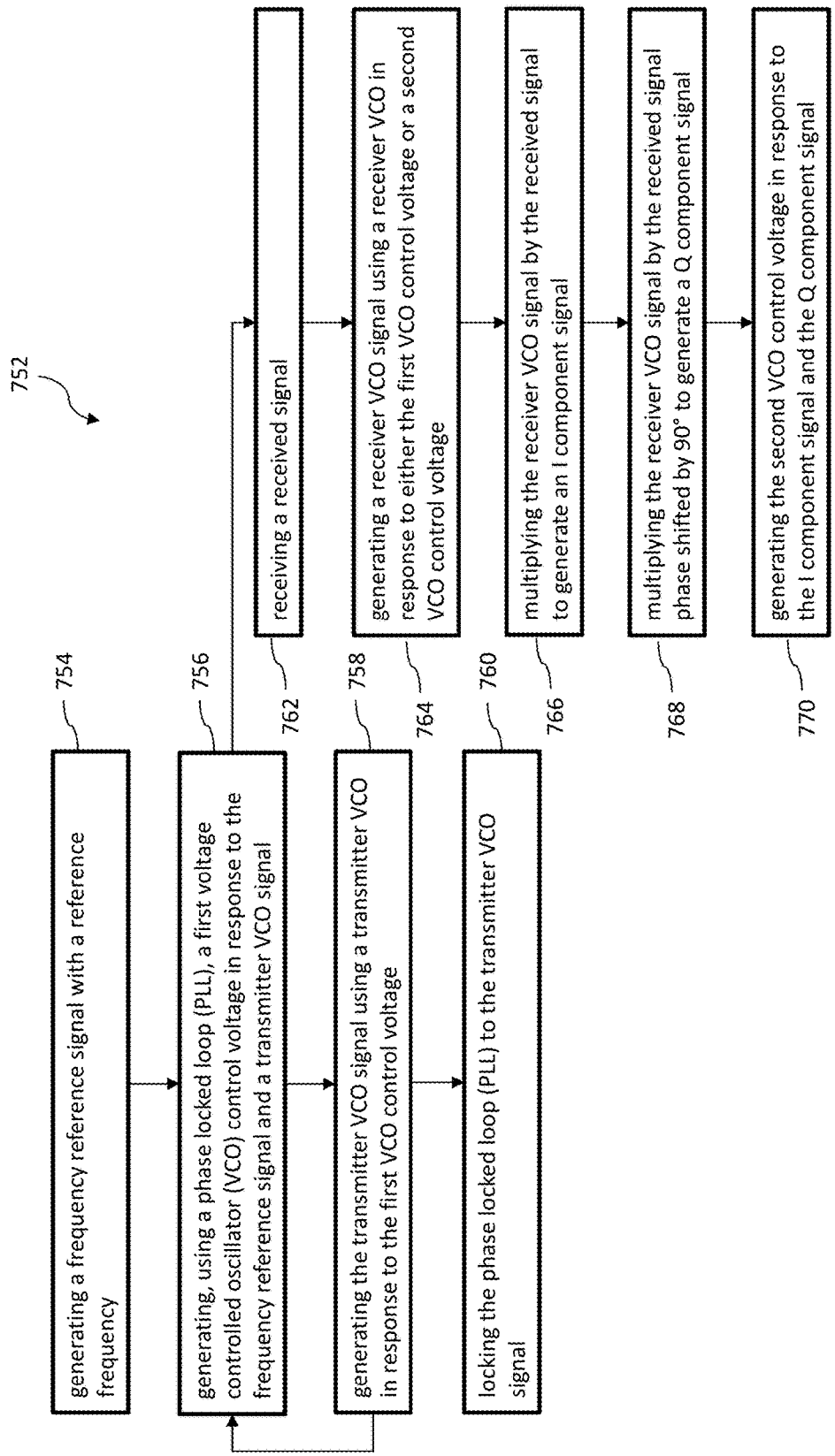
FIG. 7B shows an example process for receiving a signal using a transceiver.

FIG. 7B shows an example process 752 for receiving a signal using a transceiver. Steps 754 through 760 are performed in a transmitter of the transceiver. In step 754, a frequency reference generator generates a frequency reference signal with a reference frequency. In step 756, a PLL generates a first VCO control voltage in response to the frequency reference signal and a transmitter VCO signal. The transmitter VCO signal is a feedback signal, and can be divided by a factor (for example, an integer factor N) prior to being used to generate the first VCO control voltage. In step 757, the transmitter VCO signal is generated, using a VCO of the transmitter, in response to the first VCO control voltage. A frequency of the transmitter VCO signal depends on the first VCO control voltage. In step 760, the PLL locks to the transmitter VCO signal. After step 760, the transmitter uses the transmitter VCO signal as a carrier, modulates the transmitter VCO signal with I and Q data signals, and transmits the resulting modulated signal.

Steps 762 through 770 are performed in a receiver of the transceiver. In step 762, the receiver receives a signal. In step 764, a receiver VCO generates a receiver VCO signal in response to either the first VCO control voltage or a second VCO control voltage. Initially, the receiver VCO uses the first VCO control voltage (which originated in the transmitter) to generate the receiver VCO signal. This enables the receiver to create a signal which closely matches the frequency of a carrier signal that was modulated to generate the received signal. The second VCO control voltage (generated as described below) is used to tune that match, and particularly to match the phase of the receiver VCO signal to the phase of the carrier signal of the received signal. This is done because the carrier signal of the received signal is the transmitter VCO signal, as recovered by the transceiver that transmitted the received signal (and therefore, phase shifted due to, for example, transmission time).

In step 766, a mixer multiplies the receiver VCO signal by the received signal to generate an I component signal. In step 768, the mixer also multiplies the receiver VCO signal by the received signal phase shifted by 90° to generate a Q component signal. In step 770, a carrier recovery block generates the second VCO control voltage in response to a differential between the I component signal and the Q component signal. Initially, the receiver VCO uses the first VCO control voltage to generate the receiver VCO signal. After the receiver VCO signal and the second control voltage stabilize, the receiver VCO uses the second control voltage to generate the receiver VCO signal.

Figure 8A:
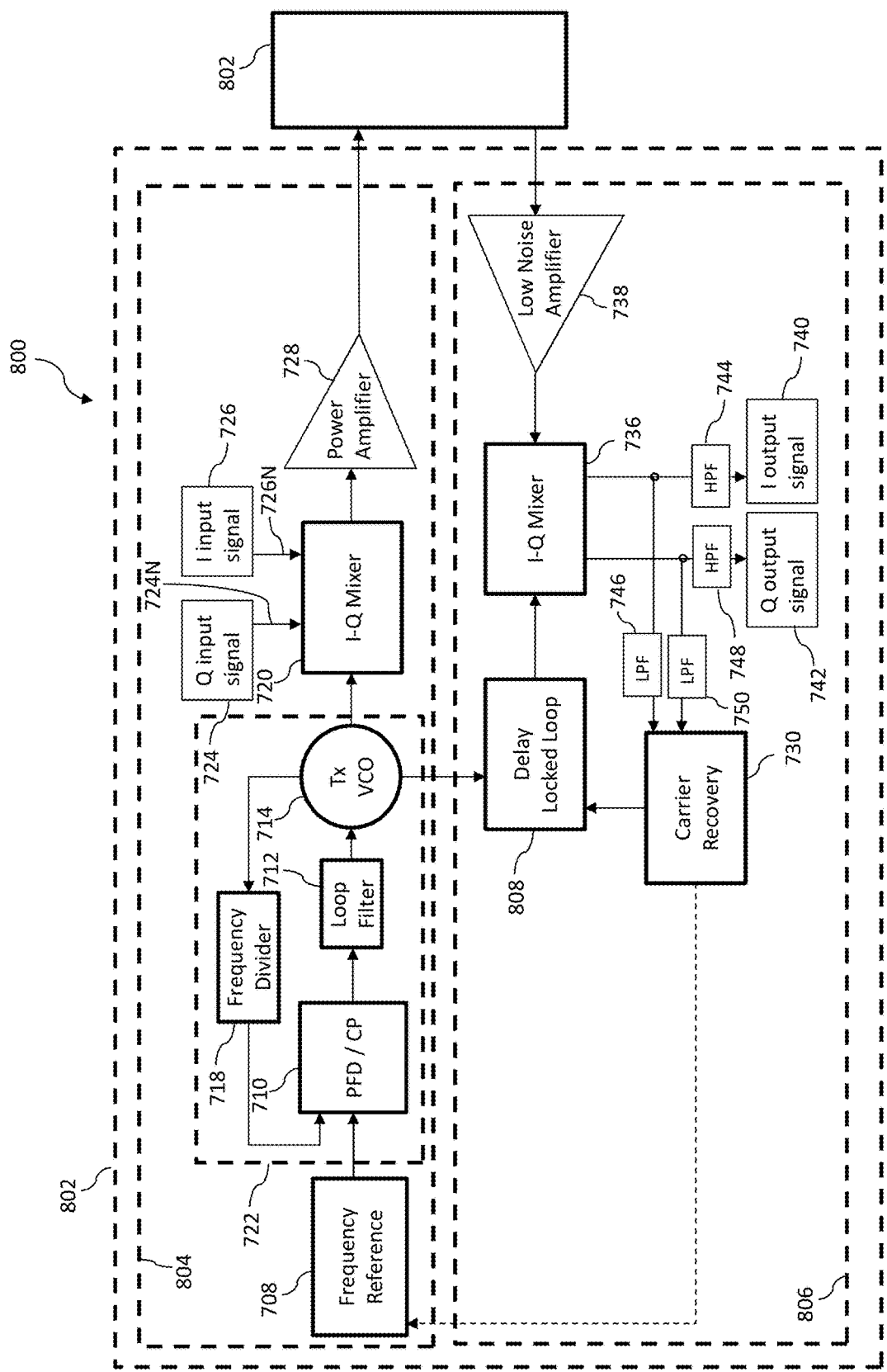
FIG. 8A shows an example of a functional block layout of a transceiver system with a transmitter and receiver in a master-slave configuration.

FIG. 8A shows an example of a functional block layout 800 of a transceiver system 802 with a transmitter 804 and receiver 806 in a master-slave configuration. The transceiver system 802 transmits an output signal to, and receives an input signal from, another transceiver system 802. One of the transceiver systems 802 operates as a master, and the other operates as a slave, as further described below. Some of the functional blocks and connections in FIG. 8A are similar to those in FIG. 7A. Accordingly, functional blocks in FIG. 8A with similar function to corresponding functional blocks in FIG. 7A are given the same identifying number as in FIG. 7A.

FIG. 8A does not include the switch 716, control logic 732, or Rx VCO 734 of FIG. 7A. Instead, the Tx VCO 714 output is connected (in addition to the frequency divider 718) as a first input to a delay locked loop 808. The carrier recovery block 730 is connected as a second input to the delay locked loop 808; in a slave configuration (indicated by the dotted line), the carrier recovery block 730 output is also connected as a control voltage of the frequency reference 708. The delay locked loop 808 output is connected to the I-Q mixer 736. The delay locked loop 804 delays communication of the Tx VCO 714 output signal—the carrier signal generated by the transmitter 804—by an amount determined by a DELAY control voltage generated by the carrier recovery block 730. The carrier recovery block 730 generates the DELAY control voltage in response to a differential between the low pass filtered I and Q signals output by the I-Q mixer 736. The control voltage is generated to decrease the I-Q mixer 736 output differential and thereby bring the Tx VCO 714 output, as delayed by the delay locked loop 804, into phase with a carrier signal component of the receiver input signal.

In a slave configuration, a REFERENCE control voltage is also generated in response to the I-Q mixer 736 output differential, and output to the frequency reference 708, to tune the reference frequency of the frequency reference 708 output so that the frequency of the output of the slave Tx VCO 714 matches the frequency of the carrier signal component of the receiver input signal. The frequency of the slave Tx VCO 714 matching the frequency of the carrier signal component of the receiver input signal means that the frequency of the slave Tx VCO 714 output is the same as the frequency of the master Tx VCO 714 output. The slave transmitter 804 uses this same slave Tx VCO 714 output as its carrier signal when transmitting to the master receiver 806.

Because the slave transmitter 804 uses the same frequency for its carrier signal as the master transmitter, it is sufficient to use a delay locked loop 804, instead of a second VCO, to recover the carrier signal component of the receiver input signal. To reiterate: the frequency of the master Tx VCO 714 output is the same as the frequency of the slave Tx VCO 714 output. Therefore, only the phase shift of the carrier signal component of the receiver input signal received by the master receiver 806 needs to be compensated for, because the master Tx VCO 714 already provides the correct frequency. The purpose of the delay locked loop 804 is compensation for this phase shift.

Figure 8B:
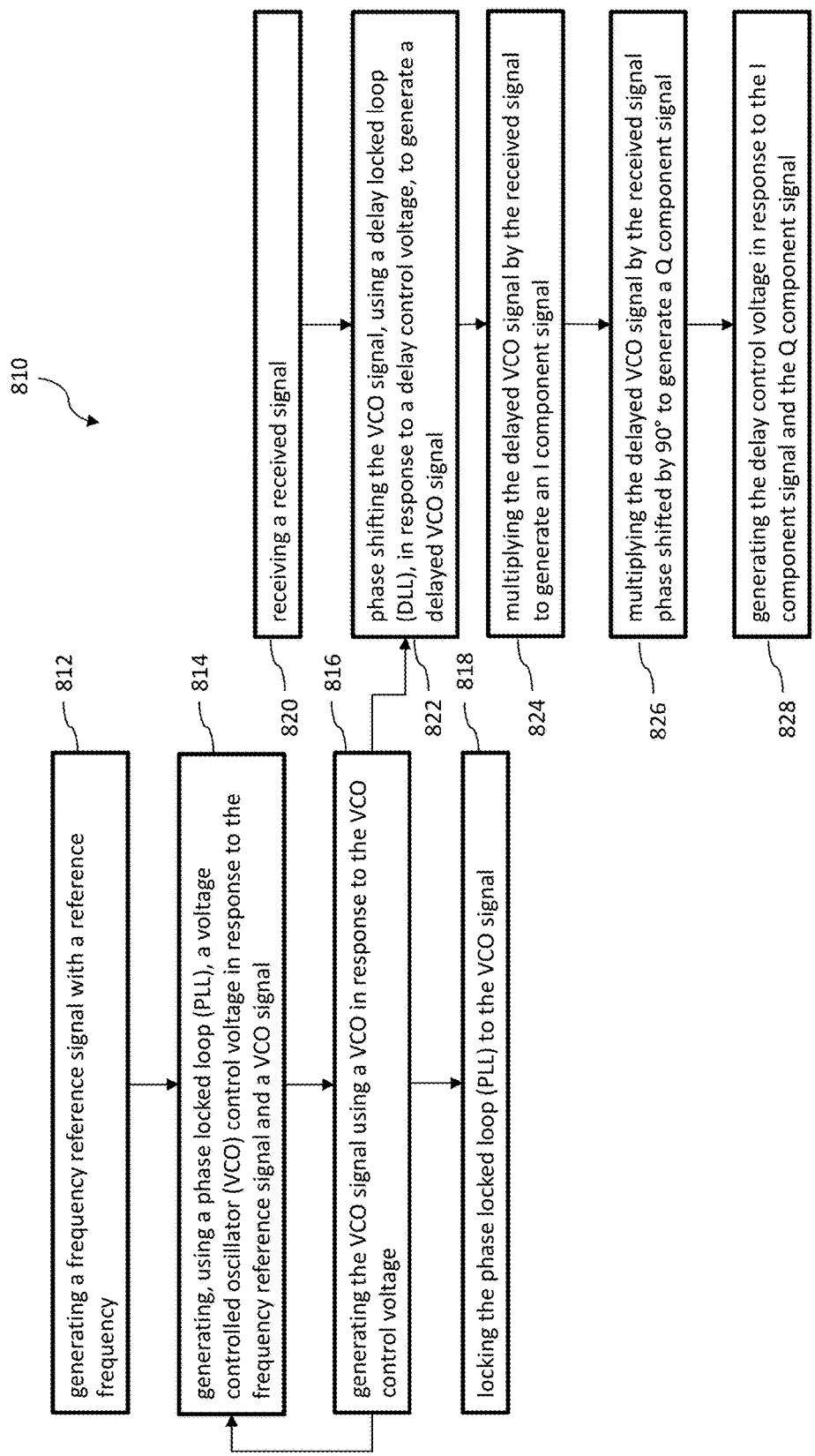
FIG. 8B shows an example process 810 for receiving a signal using a transceiver system with a transmitter and receiver in a master-slave configuration.

FIG. 8B shows an example process 810 for receiving a signal using a transceiver system with a transmitter and receiver in a master-slave configuration. Steps 812 through 818 are performed in a transmitter of the transceiver. In step 812, a frequency reference generator generates a frequency reference signal with a reference frequency. In step 814, a PLL generates a VCO control voltage in response to the frequency reference signal and a VCO signal. The VCO signal is a feedback signal, and can be divided by a factor (for example, an integer factor N) prior to being used to generate the VCO control voltage. In step 816, the VCO signal is generated, using a VCO of the transmitter, in response to the VCO control voltage. A frequency of the VCO signal depends on the VCO control voltage. In step 818, the PLL locks to the VCO signal. After step 818, the transmitter uses the VCO signal as a carrier, modulates the VCO signal with I and Q data signals, and transmits the resulting modulated signal.

Steps 820 through 828 are performed in a receiver of the transceiver. In step 820, the receiver receives a signal. In step 822, a delay locked loop phase shifts the VCO signal, in response to a delay control voltage (generated as described below), to generate a delayed VCO signal. Similarly to the example process 752 described with respect to FIG. 7B, the carrier used to modulate the received signal is the VCO signal, as recovered by the transceiver that sent the received signal from the modulated signal sent after step 818. Accordingly, the VCO signal can be caused to match the carrier signal of the received signal by introducing a correct amount of delay to the VCO signal.

In step 824, the delayed VCO signal is multiplied by the received signal to generate an I component signal. In step 826, the delayed VCO signal is also multiplied by the received signal phase shifted by 90° to generate a Q component signal. In step 828, a carrier recovery block generates the delay control voltage in response to a differential between the I component signal and the Q component signal.

Modifications are possible in the described embodiments, and other embodiments are possible, within the scope of the claims.

In some embodiments, the leaky carrier is added to the Q component and not to the I component before the I component, the Q component, and the carrier signal are mixed together by the Tx I-Q mixer. In some embodiments, a leaky carrier signal is added to both the I and Q components.

In some embodiments using a leaky carrier, an I input signal is encoded using the PCIe 4.0 16 Gbps standard, and the Q input signal is encoded using the 10G Ethernet standard. Other encoding standards, so that the data rates for the I input signal and the Q input signal are the same or different, can also be used.

In some embodiments using 16QAM, using a leaky carrier enables, after the PLL is locked to the leaky carrier, an rms phase error of less than 1.5 degrees, corresponding to a loss of less than 1.5 dB at a bit error rate of 1e-12.

In some embodiments, the leaky carrier can be added to the Q input signal instead of to the I input signal. In some embodiments, the leaky carrier can be added to both the I input signal and the Q input signal.

In some embodiments, the leaky carrier recovery block outputs a voltage control signal only to the Rx oscillator. In some embodiments, the leaky carrier recovery block outputs a voltage control signal only to the Rx frequency reference.

In some embodiments, the I-Q mixer transmits the mixed Rx input signal to the baseband amplifiers and to the leaky carrier recovery block, the baseband amplifiers high pass filter the mixed Rx input signal prior to amplification, and the leaky recovery block low pass filters the mixed Rx input signal prior to inputting the mixed Rx input signal to the PFD.

In some embodiments, a leaky carrier recovery block outputs a voltage control signal that is connected to control (tunes) a frequency reference, or a VCO output, or both. While FIG. 3 shows the leaky carrier recovery block connected to control both the Rx frequency reference and the Rx oscillator, the leaky carrier recovery block can, in some embodiments, be connected to (only) one or the other.

In some embodiments as described in Section II that do not use a leaky carrier recovery signal, the mixer output is not low pass filtered and used for carrier signal recovery.

What is claimed is:

1. A transceiver, comprising:
a frequency reference circuitry configured to generate and output a frequency reference signal with a reference frequency;
a transmitter configured to generate a first VCO control voltage responsive to the frequency reference signal, and having a transmitter voltage controlled oscillator (VCO) configured to generate a transmitter VCO signal responsive to the first VCO control voltage; and
a receiver, including:
a receiver input terminal adapted to receive a received signal;
a receiver switch having a first switch input, a second switch input, a switch control input, and a switch output, the receiver switch configured to receive the first VCO control voltage from the transmitter at the first switch input, to receive a second VCO control voltage at the second switch input, and to provide the first VCO control voltage or the second VCO control voltage at the switch output responsive to a control signal at the switch control input;
a control circuitry configured to output the control signal to the switch control input;
a receiver VCO having a receiver VCO input and a receiver VCO output, the receiver VCO input coupled to the switch output, the receiver VCO configured to output a receiver VCO signal responsive to the switch output;
an I-Q mixer having a first I-Q mixer input, a second I-Q mixer input, a first I-Q mixer output, and a second I-Q mixer output, the first I-Q mixer input coupled to the receiver VCO output, the second I-Q mixer input coupled to the receiver input terminal, the I-Q mixer configured to multiply the receiver VCO signal by the received signal to generate an I component signal at the first I-Q mixer output, the I-Q mixer configured to multiply the receiver VCO signal by the received signal phase shifted by 90° to generate a Q component signal at the second I-Q mixer output; and
a carrier recovery (CR) block having a first CR input, a second CR input, and a CR output, the first CR input coupled to the first I-Q mixer output, the second CR input coupled to the second I-Q mixer output, and the CR output coupled to the second switch input, the CR block configured to generate the second VCO control voltage responsive to the I component signal and the Q component signal, and to provide the second VCO control voltage to the CR output.

2. The transceiver of claim 1, including:
a first low pass filter having a first low pass filter input and a first low pass filter output, the first low pass filter input coupled to the first I-Q mixer output, the first low pass filter output coupled to the first CR input; and
a second low pass filter having a second low pass filter input and a second low pass filter output, the second low pass filter input coupled to the second I-Q mixer output, the second low pass filter output coupled to the second CR input.

3. The transceiver of claim 1, including:
a first high pass filter having an input and an output, the first high pass filter input coupled to the first I-Q mixer output, the first high pass filter output coupled to an I output signal terminal; and
a second high pass filter having an input and an output, the second high pass filter input coupled to the second I-Q mixer output, the second high pass filter output coupled to a Q output signal terminal.

4. The transceiver of claim 1, in which:
the control circuitry is configured to generate the control signal to initially cause the receiver switch to provide the first switch input as the switch output, and the control circuitry is configured to generate the control signal, after the receiver VCO output and the CR output stabilize, to provide the second switch input as the switch output.

5. The transceiver of claim 4, in which the control circuitry is configured to determine whether the receiver VCO output and the CR output have stabilized by determining whether a predetermined time has elapsed.

6. The transceiver of claim 4, in which the control circuitry is configured to, after the receiver VCO output and the CR output stabilize, periodically resume generating the control signal to cause the receiver switch to provide the first switch input as the switch output.

7. The transceiver of claim 1, in which the CR block is configured to generate the control voltage responsive to a differential between the first CR input and the second CR input.

8. The transceiver of claim 7, in which the CR block is configured to generate the control voltage to reduce the differential.

9. The transceiver of claim 1, the transmitter including a transmitter phase locked loop (PLL) having a transmitter PLL input and a transmitter PLL output, the transmitter VCO part of the transmitter PLL, the transmitter PLL input configured to receive the frequency reference signal from the frequency reference circuitry, the transmitter PLL configured to generate the first VCO control voltage responsive to the frequency reference signal and the transmitter VCO signal.

10. The transceiver of claim 1, in which:
the transmitter is configured to modulate the transmitter VCO signal using a data signal to generate a transmission signal, and to transmit the transmission signal out of the transceiver; and
the receiver is configured to, after the receiver VCO signal stabilizes, demodulate the received signal using the receiver VCO signal as a recovered carrier signal of the received signal.

11. A transceiver, comprising:
a frequency reference circuitry configured to generate and output a frequency reference signal with a reference frequency;
a transmitter having a transmitter voltage controlled oscillator (VCO) configured to generate a transmitter VCO signal responsive to the frequency reference signal; and
a receiver, including:
a receiver input terminal adapted to receive a received signal;
a receiver delay locked loop (DLL) having a first receiver DLL input, a second receiver DLL input, and a receiver DLL output, the receiver DLL configured to receive the transmitter VCO signal from the transmitter at the first receiver DLL input and to delay a phase of the transmitter VCO signal responsive to a delay control voltage at the second receiver DLL input to generate a delayed transmitter VCO signal at the receiver DLL output;
an I-Q mixer having a first I-Q mixer input, a second I-Q mixer input, a first I-Q mixer output, and a second I-Q mixer output, the first I-Q mixer input coupled to the receiver DLL output, the second I-Q mixer input coupled to the receiver input terminal, the I-Q mixer configured to multiply delayed transmitter VCO signal by the received signal to generate an I component signal at the first I-Q mixer output, the I-Q mixer configured to multiply the delayed transmitter VCO signal by the received signal phase shifted by 90° to generate a Q component signal at the second I-Q mixer output; and
a carrier recovery (CR) block having a first CR input, a second CR input, and a first CR output, the first CR input coupled to the first I-Q mixer output, the second CR input coupled to the second I-Q mixer output, and the first CR output coupled to the second receiver DLL input, the CR block configured to generate a DLL control voltage responsive to the I component signal and the Q component signal, and to provide the DLL control voltage at the first CR output.

12. The transceiver of claim 11, including:
a first low pass filter having a second low pass filter input and a second low pass filter output, the first low pass filter input coupled to the first I-Q mixer output, the first low pass filter output coupled to the first CR input; and
a second low pass filter having a second low pass filter input and a second low pass filter output, the second low pass filter input coupled to the second I-Q mixer output, the second low pass filter output coupled to the second CR input.

13. The transceiver of claim 11, including:
a first high pass filter having a first high pass filter input and a first high pass filter output, the first high pass filter input coupled to the first I-Q mixer output, the first high pass filter output coupled to an I output signal terminal; and
a second high pass filter having a second high pass filter input and a second high pass filter output, the second high pass filter input coupled to the second I-Q mixer output, the second high pass filter output coupled to a Q output signal terminal.

14. The transceiver of claim 11, in which the CR block is configured to generate the control voltage responsive to a differential between the first CR input and the second CR input.

15. The transceiver of claim 14, in which the CR block is configured to generate the control voltage to reduce the differential.

16. The transceiver of claim 11, in which:
the CR block has a second CR output and the frequency reference circuitry having a frequency reference input, the frequency reference input coupled to the second CR output;
the CR block is configured to generate a frequency reference control signal responsive to a differential between the first CR input and the second CR input, and to provide the frequency reference control signal to the second CR output; and
the frequency reference circuitry is configured to generate the frequency reference signal responsive to the frequency reference input.

17. The transceiver of claim 11, the transmitter including a transmitter phase locked loop (PLL) having a transmitter PLL input and a transmitter PLL output, the transmitter VCO part of the transmitter PLL, the transmitter PLL input configured to receive the frequency reference signal from the frequency reference circuitry, the transmitter PLL configured to generate a VCO control voltage responsive to the frequency reference signal and the transmitter VCO signal, the transmitter VCO configured to receive the VCO control voltage from the transmitter PLL and configured to output the transmitter VCO signal responsive to the VCO control voltage.

18. The transceiver of claim 11, in which:
the transmitter is configured to modulate the transmitter VCO signal using a data signal to generate a transmission signal, and to transmit the transmission signal out of the transceiver; and
the receiver is configured to, after the receiver DLL output stabilizes, demodulate the received signal using the receiver DLL output as a recovered carrier signal of the received signal.

19. A method of operating a transceiver, comprising:
generating a frequency reference signal with a reference frequency;
in a transmitter of the transceiver:
generating, using a phase locked loop (PLL), a first voltage controlled oscillator (VCO) control voltage responsive to the frequency reference signal and a transmitter VCO signal;
generating the transmitter VCO signal using a transmitter VCO responsive to the first VCO control voltage; and
locking the phase locked loop (PLL) to the transmitter VCO signal; and in a receiver of the transceiver:
receiving a received signal;
generating a receiver VCO signal, using a receiver VCO, responsive to either the first VCO control voltage or a second VCO control voltage;
multiplying the receiver VCO signal by the received signal to generate an I component signal;
multiplying the receiver VCO signal by the received signal phase shifted by 90° to generate a Q component signal; and
generating the second VCO control voltage responsive to the I component signal and the Q component signal;
in which the generating a receiver VCO signal is performed, for an initial time period, responsive to the first VCO control voltage, and
in which the generating a receiver VCO signal is performed, after the initial time period, responsive to the second VCO control voltage.

20. The method of claim 19, including:
low pass filtering the I component signal and the Q component signal, and performing the generating the second VCO control voltage using the low pass filtered I component signal and the low pass filtered Q component signal.

21. The method of claim 19, including:
high pass filtering the I component signal to generate an I output signal, and high pass filtering the Q component signal to generate a Q output signal.

22. The method of claim 19 in which the receiver VCO signal and the second VCO control voltage are determined to have stabilized by determining that the initial time period has elapsed.

23. The method of claim 19 in which after the receiver VCO signal and the second VCO control voltage stabilize, the generating a receiver VCO signal periodically resumes being performed responsive to the first VCO control voltage.

24. The method of claim 19, in which the generating the second VCO control voltage is performed responsive to a differential between the I component signal and the Q component signal.

25. The method of claim 19, including:
in the transmitter:
modulating the transmitter VCO signal using an I input signal and a Q input signal to generate a modulated signal; and
transmitting the modulated signal; and
in the receiver, after the receiver VCO signal stabilizes, demodulating the received signal using the receiver VCO signal as a recovered carrier signal of the received signal.

26. A method of operating a transceiver, comprising:
generating a frequency reference signal having a reference frequency; in a transmitter of the transceiver:
generating, using a phase locked loop (PLL), a voltage controlled oscillator (VCO) control voltage responsive to the frequency reference signal and a transmitter VCO signal;
generating, using a VCO, the transmitter VCO signal responsive to the VCO control voltage; and
locking the phase locked loop (PLL) to the transmitter VCO signal; and in a receiver of the transceiver:
receiving a received signal and the transmitter VCO signal;
phase shifting the transmitter VCO signal, using a delay locked loop (DLL), responsive to a delay control voltage to generate a delayed transmitter VCO signal;
multiplying the delayed transmitter VCO signal by the received signal to generate an I component signal;
multiplying the delayed transmitter VCO signal by the received signal phase shifted by 90° to generate a Q component signal; and
generating the delay control voltage responsive to the I component signal and the Q component signal.

27. The method of claim 26, including:
low pass filtering the I component signal and the Q component signal, and performing the generating the delay control voltage using the low pass filtered I component signal and the low pass filtered Q component signal.

28. The method of claim 26, including:
high pass filtering the I component signal to generate an I output signal, and high pass filtering the Q component signal to generate a Q output signal.

29. The method of claim 26, in which the generating the delay control voltage is performed responsive to a differential between the I component signal and the Q component signal.

30. The method of claim 29, including:
generating a frequency reference control voltage, in the receiver, responsive to the I component signal and the Q component signal,
the generating the frequency reference signal is performed responsive to the frequency reference control voltage, and
the generating the frequency reference control voltage is performed to reduce the differential.

31. The method of claim 2, including:
in the transmitter:
modulating the transmitter VCO signal using an I input signal and a Q input signal to generate a modulated signal; and
transmitting the modulated signal; and
in the receiver, after the delayed transmitter VCO signal stabilizes, demodulating the received signal using the delayed transmitter VCO signal as a recovered carrier signal of the received signal.

32. A receiver comprising:
a switch having first and second inputs and an output, and the switch is configured to receive a first voltage controlled oscillator (VCO) control voltage from a transmitter at the first input;
a VCO having a respective input and a respective output, the input of the VCO coupled to the output of the switch;
an I-Q mixer having respective first and second inputs and respective first and second outputs, the first input of the I-Q mixer coupled to the output of the VCO, and the I-Q mixer configured to receive an input signal at the second input of the IQ mixer; and
a carrier recovery (CR) block having respective first and second inputs and a respective output, the first input of the CR block coupled to the first output of the I-Q mixer, the second input of the CR block coupled to the second output of the I-Q mixer, the output of the CR block coupled to the second input of the switch, and the CR block configured to provide a second VCO control voltage at the output of the CR block; and in which the switch is configured to switch between providing the first VCO control voltage from the transmitter and providing the second VCO control voltage from the CR block at the output of the switch.

33. A receiver comprising:
- a delay locked loop (DLL) having first and second inputs and an output, the DLL configured to receive a VCO signal from a transmitter at the first input and to provide a delayed VCO signal at the output responsive to a delay control voltage at the second input;
- an I-Q mixer having respective first and second inputs and respective first and second outputs, the first input of the I-Q mixer coupled to the output of the DLL, and the I-Q mixer configured to receive an input signal at the second input of the I-Q mixer; and
- a carrier recovery (CR) block having respective first and second inputs and a respective output, the first input of the CR block coupled to the first output of the I-Q mixer, the second input of the CR block coupled to the second output of the I-Q mixer, the output of the CR block coupled to the second input of the DLL, and the CR block configured to provide the delay control voltage at the output of the CR block.

* * * * *